United States Patent [19]
Caton et al.

[11] Patent Number: 5,303,558
[45] Date of Patent: Apr. 19, 1994

[54] THERMAL TRAP FOR GASEOUS MATERIALS

[75] Inventors: Oscar L. Caton, Boerne; Craig A. Bellows, San Antonio; Curtis M. Hebert, Jr., San Antonio; Steve J. Schaper, San Antonio, all of Tex.

[73] Assignee: VLSI Technology, Inc., San Jose, Calif.

[21] Appl. No.: 923,291

[22] Filed: Jul. 30, 1992

[51] Int. Cl.$^5$ .............................................. B01D 8/00
[52] U.S. Cl. ......................................... 62/55.5; 62/8; 62/12
[58] Field of Search .................. 62/8, 12, 55.5; 55/82, 55/269

[56] References Cited

U.S. PATENT DOCUMENTS

| | | | |
|---|---|---|---|
| 3,144,200 | 8/1964 | Taylor et al. | 62/55.5 |
| 3,712,074 | 1/1973 | Boissin | 62/55.5 |
| 3,788,096 | 1/1974 | Brilloit | 62/55.5 |
| 4,036,594 | 7/1977 | Ibing et al. | 55/82 X |
| 4,148,196 | 4/1979 | French et al. | 62/55.5 |
| 4,479,927 | 10/1984 | Gelernt | 62/55.5 X |
| 4,506,513 | 3/1985 | Max | 62/55.5 |
| 4,551,197 | 11/1985 | Guilmette et al. | 62/55.5 X |
| 4,816,046 | 3/1989 | Maeba et al. | 55/269 X |

*Primary Examiner*—Henry A. Bennet
*Assistant Examiner*—C. Kilner
*Attorney, Agent, or Firm*—Hickman & Beyer

[57] ABSTRACT

A semiconductor deposition system with thermal trap characterized by a processing chamber, a source of process gas coupled to an inlet of the processing chamber, a thermal trap coupled to an outlet of the processing chamber, and a pump mechanism operative to pump a gas from the process chamber and into the thermal trap. The thermal trap preferably includes an enclosure defining a trap chamber, where an inlet to the trap chamber is coupled to the outlet of the processing chamber, a condensable-solid collection surface located within the trap chamber, a mechanism for maintaining the temperature of the collection surface at or below the temperature at which a gas flowing into the chamber condenses into a solid form, and a mechanism for maintaining the temperature of an inner surface of the enclosure at a temperature above which the gas condenses into a solid form. A method for trapping a gaseous material is characterized by the steps of flowing a gaseous material into a chamber of an enclosure, and maintaining the temperature of a collection surface disposed within the chamber at or below the temperature at which the gaseous material condenses into a solid form. The method preferably also includes the step of maintaining the temperature of an inner surface of the enclosure above the temperature at which the gaseous material condenses into a solid.

15 Claims, 5 Drawing Sheets

THERMAL TRAP FOR GASEOUS MATERIALS

BACKGROUND OF THE INVENTION

This invention relates generally to semiconductor manufacturing equipment, and more particularly to traps and filters for removing gaseous materials from exhaust gasses of semiconductor manufacturing equipment.

Semiconductor wafers are processed within processing chambers of semiconductor manufacturing equipment to produce integrated circuits (ICs). For example, semiconductor wafers can be processed within a plasma etch machine to remove material from the wafer surface, or can be processed with in a chemical vapor deposition (CVD) machine to deposit layers of material over the wafer surface.

A common processing step is the deposition of a silicon-nitride passivation layer over a semiconductor wafer. One process for forming silicon-nitride layers is to react ammonia ($NH_3$) with dichlorosilane ($SiH_2Cl_2$) within a wafer processing chamber. Unfortunately, one of the by-products of the reaction is ammonium chloride ($NH_4Cl$) which is a gaseous material at processing temperatures (e.g. greater than about 300° C. and typically about 700° C.) but which forms a solid condensate at temperatures below about 125° C.

A problem occurs when pumping waste gasses from a silicon-nitride processing chamber during processing. The ammonium chloride, which is initially in a gaseous state, condenses as a solid in the exhaust pipes and within the exhaust pump used to extract the waste gasses from the chamber. Ammonium chloride condensed in the exhaust pipes and pump can back-flow into the processing chamber under certain circumstances, which can contaminate the chamber and any wafer within the chamber. This type of contamination can produce a "nitride haze" on the wafers being processed with undesirable and sometimes damaging results.

Condensed ammonium chloride within the pump mechanism is particularly problematical. The pumps used are typically molecular pumps designed to pump very low pressure gasses. When ammonium chloride deposits within the pump mechanism, it forms a salt-like substance which grinds the delicate internal surfaces of the pump. This can lead to premature wear, reduced efficiency, and ultimately the failure of the pump.

SUMMARY OF THE INVENTION

The present invention provides a thermal trap for gaseous materials which greatly reduces back-flow of materials into a process chamber forward-flow of condensed solids into a pump mechanism. When used with a nitride CVD process, the thermal trap of the present invention reduces or eliminates the nitride haze problem and greatly prolongs the life and efficiency of the system's molecular pump.

The thermal trap includes an enclosure defining a trap chamber, a condensable-solid collection surface located within the trap chamber, and a mechanism for maintaining the temperature of the collection surface at or below the temperature at which a gas flowing into an inlet of the trap chamber condenses into a solid form. Preferably, an inlet flow axis to the trap chamber does not impinge upon the collection surface to prevent the re-vaporization of the condensed material. The thermal trap also preferably includes a mechanism for maintaining the temperature of an inner surface of the enclosure above the temperature at which the gas condenses into a solid form to prevent condensation on the inner walls of the enclosure.

The thermal trap forms an important part of a complete deposition system including a processing chamber, a source of process gas coupled to a gas inlet of the processing chamber, the above-described thermal trap coupled to an exhaust outlet of the processing chamber, and a pump mechanism coupled to an outlet of the thermal trap. The inlet to the trap chamber of the thermal trap is preferably located such that radiant heat generated by the process chamber does not directly impinge upon the collection surface of the thermal trap.

The method of the present invention includes the steps of flowing a gaseous material into a trap chamber of an enclosure and maintaining the temperature of a collection surface disposed within the trap chamber at a temperature at or below the temperature at which the gaseous material condenses as a solid on the collection surface. The method of the present invention also preferably includes the step of maintaining the temperature of an inner surface of the enclosure above the temperature at which the gaseous material condenses into a solid.

The present invention therefore removes condensable-solid gasses from the exhaust gas of a semiconductor processing chamber, thereby reducing contamination of the chamber due to back-flow and reducing wear and damage to the exhaust pump mechanism.

These and other advantages of the present invention will become apparent to those skilled in the art upon a reading of the following specification of the invention and a study of the several figures of the drawing.

DETAILED DESCRIPTION OF THE PREFERRED EMBODIMENTS

Figure 1:
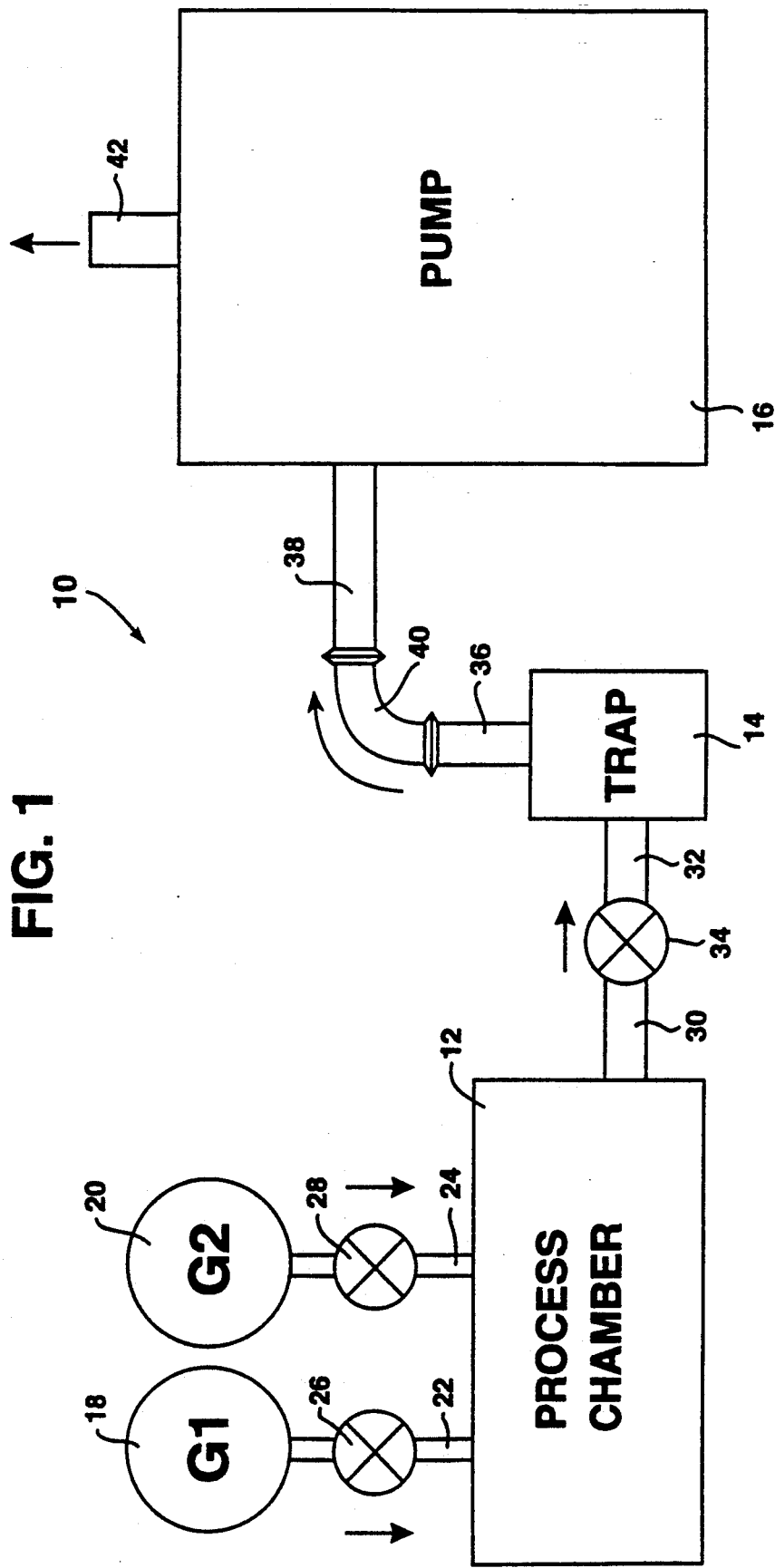
FIG. 1 is a pictorial view of a semiconductor processing system utilizing a thermal trap of the present invention.

FIG. 1 illustrates a deposition system 10 including a process chamber 12, a thermal trap 14, and an exhaust pump 16. A pair of gas sources 18 and 20 are coupled to inlets 22 and 24 of process chamber 12 by valves 26 and 28, respectively, and an outlet 30 of the process chamber 12 is coupled to an inlet 32 of thermal trap 14 by an isolation valve 34. An outlet 36 of thermal trap 14 is coupled to an inlet 38 of pump 16 by a conduit or pipe 40. An outlet 42 of pump 16 exhausts certain gaseous materials pumped from the process chamber 12 through the thermal trap 14. The arrows in FIG. 1 indicate the direction of forward-flow of the process and exhaust gasses.

The process chamber 12 can be any of a number of types of process chambers available from a variety of vendors. In a preferred embodiment of the present invention, the process chamber 12 is a THERMCO 10000

Nitride CVD machine available from SVG Thermco Company of San Jose, Calif. The THERMCO 10000 is essentially a low pressure chemical vapor deposition (LPCVD) furnace which is well suited for the deposition of nitride layers on semiconductor wafers.

Gas sources 18 and 20 include two different gasses G1 and G2. Gas G1 is preferably high-purity ammonia ($NH_3$) gas, and gas G2 is preferably high purity dichlorosilane ($SiH_2Cl_2$) gas. Gasses G1 and G2 are reacted within process chamber 12 by well known processes to form a nitride layer on one or more semiconductor wafers located within the chamber. One of the by-products of the reaction is ammonium chloride ($NH_4Cl$), which can be exhausted from the chamber via outlet 30.

The thermal trap 14 will be discussed in greater detail with reference to FIGS. 2-5. The pump 16 is preferably a molecular pump, such as the Leybold D90 molecular pump available from Leybold-Heraeus, Inc. of San Jose, Calif.

In operation, a wafer of wafers are placed within the process chamber 12, and the process chamber is then sealed. The isolation valve 34 is then opened and the pump 16 is activated to create a partial vacuum within the process chamber 12. Gasses G1 and G2 are then allowed to flow into the process chamber 12 by opening valves 26 and 28, and a chemical vapor deposition (CVD) reaction is allowed to take place to deposit a nitride layer on the wafer or wafers. The pump 16 maintains the pressure within the process chamber at about 200 millitorr during the processing cycle by drawing exhaust gasses from the chamber 12 into the thermal trap 14 where the ammonium chloride is trapped. Other gasses are pulled through the thermal trap 14 and are exhausted from outlet 42 of the pump 16. Deposition continues until the nitride layer is of a desired thickness, and then the valves 26 and 28 are closed to cut-off the flow of process gasses G1 and G2 into the process chamber 12. The pump 16 continues to evacuate the process chamber 12 for a period of time, and then isolation valve 34 is closed and the process chamber is vented to atmospheric pressure to allow the removal of the wafer or wafers.

Figure 2:
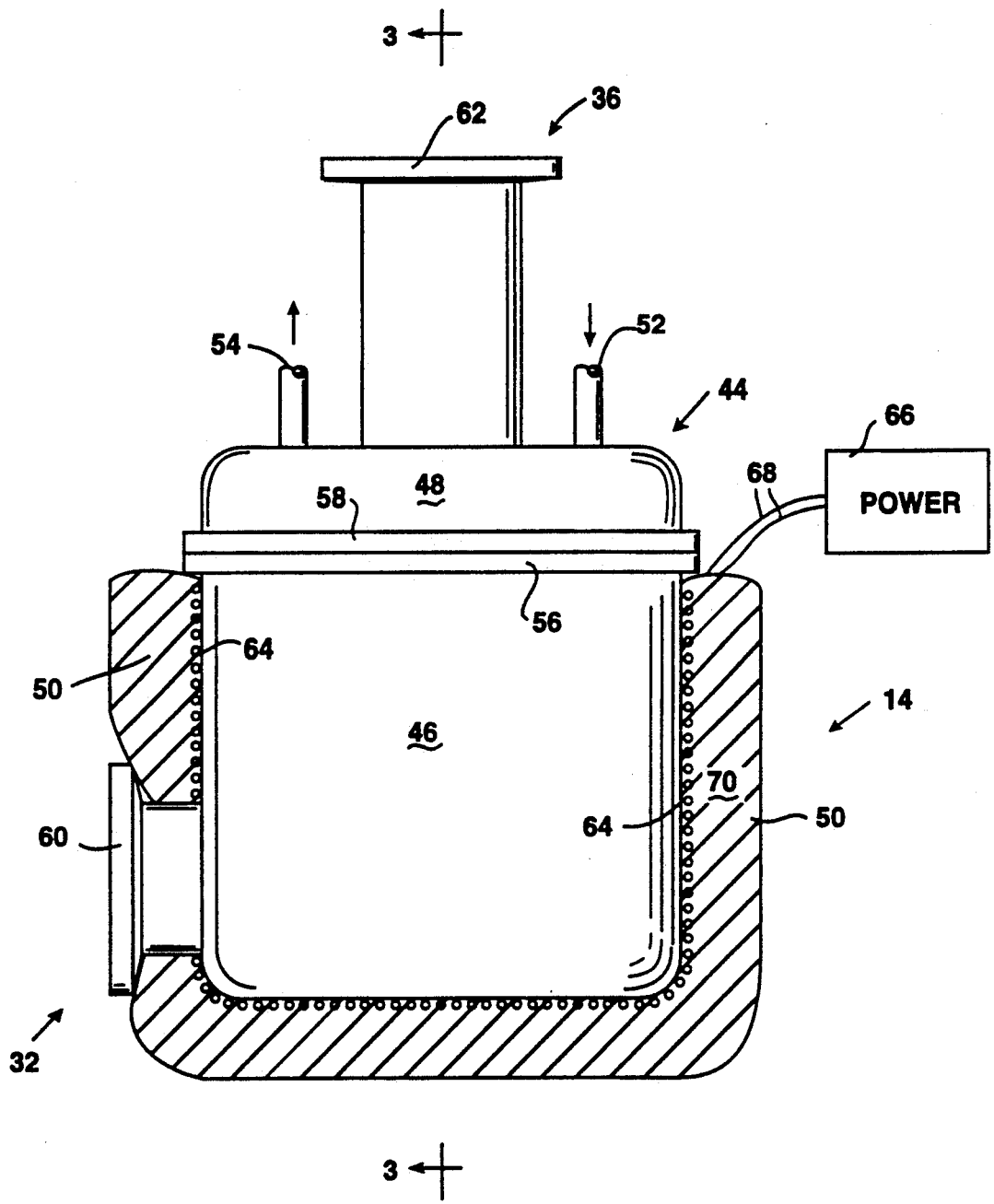
FIG. 2 is a front elevational of the thermal trap of FIG. 2.

FIG. 2 illustrates the thermal trap 14 in greater detail. The trap 14 includes an enclosure 44 having a kettle section 46 and a lid section 48. Inlet 32 is attached to the side of the kettle section 46, and the outlet 36 is attached to the top of the lid section 48. A heating mechanism 50 contacts and surrounds a majority of the external surface of kettle section 48. An inlet 52 to a cooling coil (not shown in this figure) and an outlet 54 from the cooling coil extend through sealed holes in the lid 48.

Kettle section 46 is provided with a flange 56 around its mouth, and lid 48 is provided with a flange 58 around the base of its skirt. Flanges 56 and 58 are operationally engaged to provide a preferably gas-tight seal, and are held together with fastening means (not seen in this figure). Inlet 32 is provided with a flange 60 to attach to an inlet pipe (not shown) leading to isolation valve 34, and outlet 36 is provided with a flange 62 to attach to a corresponding flange on pipe 40.

The enclosure 44 can be made by modifying a mesh trap available as part number 433022 from MDC Vacuum Products of Hayward, Calif. The MDC pressure chamber is made from stainless steel, has an inlet on the bottom and an outlet on the top, is about eight inches tall and is about six inches in diameter. The mesh (if any) is removed from the trap. The bottom inlet is removed and is then welded onto the side of the kettle 46 to form inlet 32 for reasons to be discussed subsequently. The hole left on the bottom of kettle 46 by the removal of the inlet is plugged and sealed.

The heating mechanism 50 is a combination electrical resistance heater and thermal insulator blanket available from such companies as the HPS division of MKS Instruments, Inc., located in Albuquerque, N.Mex. More specifically, the heating mechanism 50 includes an electrically resistive coil 64 coupled to an electrical power source 66 by wires 68, and a thermally insulating blanket 70 wrapped around the coil 64. The coil is thermally coupled to the outer surface of the kettle 46, and the blanket 70 reduces thermal coupling of the coil 64 to the ambient environment.

The heating mechanism 50 substantially covers the outer surface of kettle 46, and is shown broken away for the purpose of this discussion. The heating mechanism 50 heats the walls of the kettle 46 to about 140° C.

Figure 3:
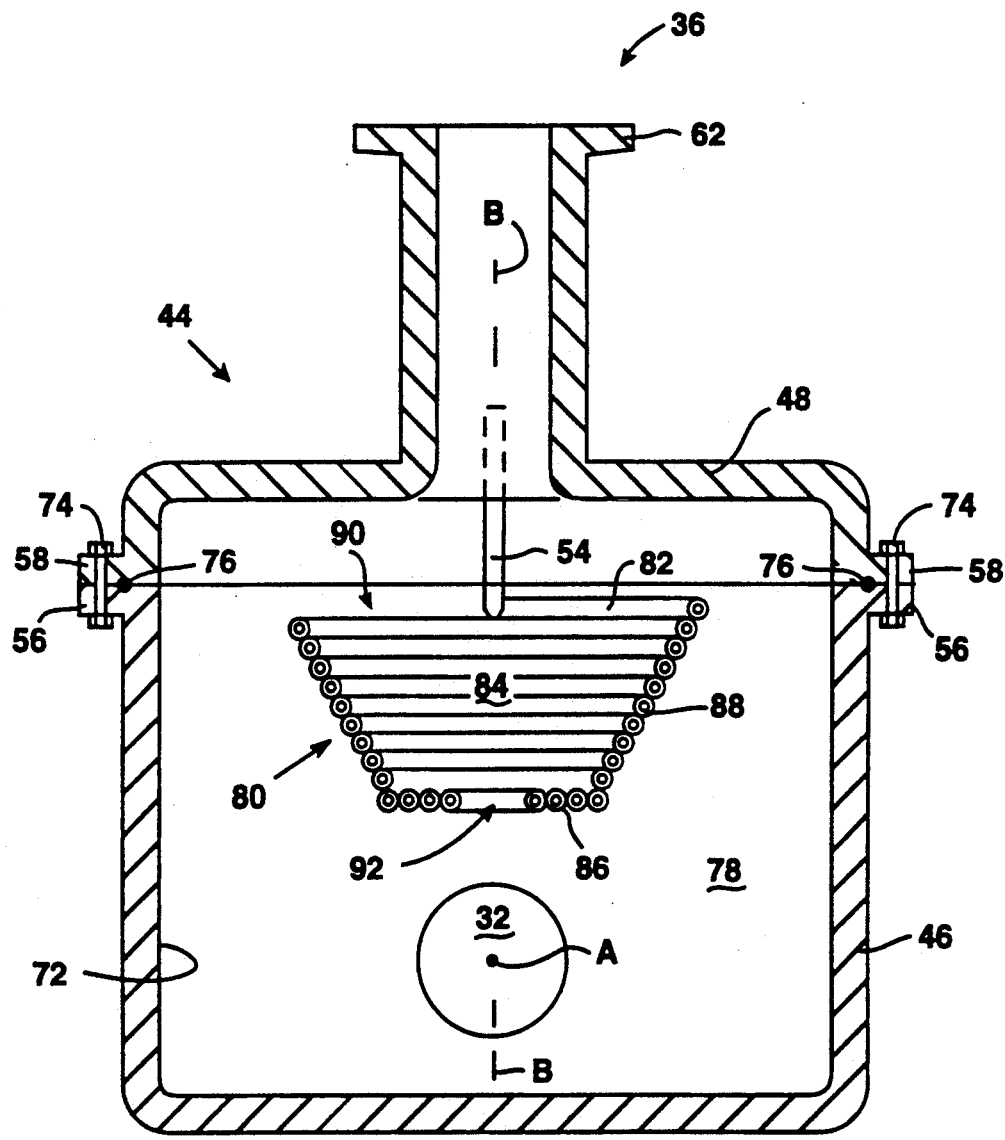
FIG. 3 is a cross-sectional view taken along line 3—3 of FIG. 2.

FIG. 3 is a cross-sectional view taken along line 3—3 of FIG. 2. The heating mechanism 50 is not shown in this figure. In FIG. 3, the inner surface 72 of kettle 46 can be seen, as can fasteners 74 which hold flanges 56 and 58 together. An O-ring 76 is preferably located between flanges 56 and 58 to provide a gas-tight seal.

The enclosure 44 defines a trap chamber 78 within its walls. Located within the trap chamber 78 is a condensable-solid collection surface 80 which condenses certain gaseous materials entering inlet 32 of chamber 78 as a solid residue on its surface. The collection surface 80 preferably comprises a length of tubing 82 wound into a coil 84.

Figure 4:
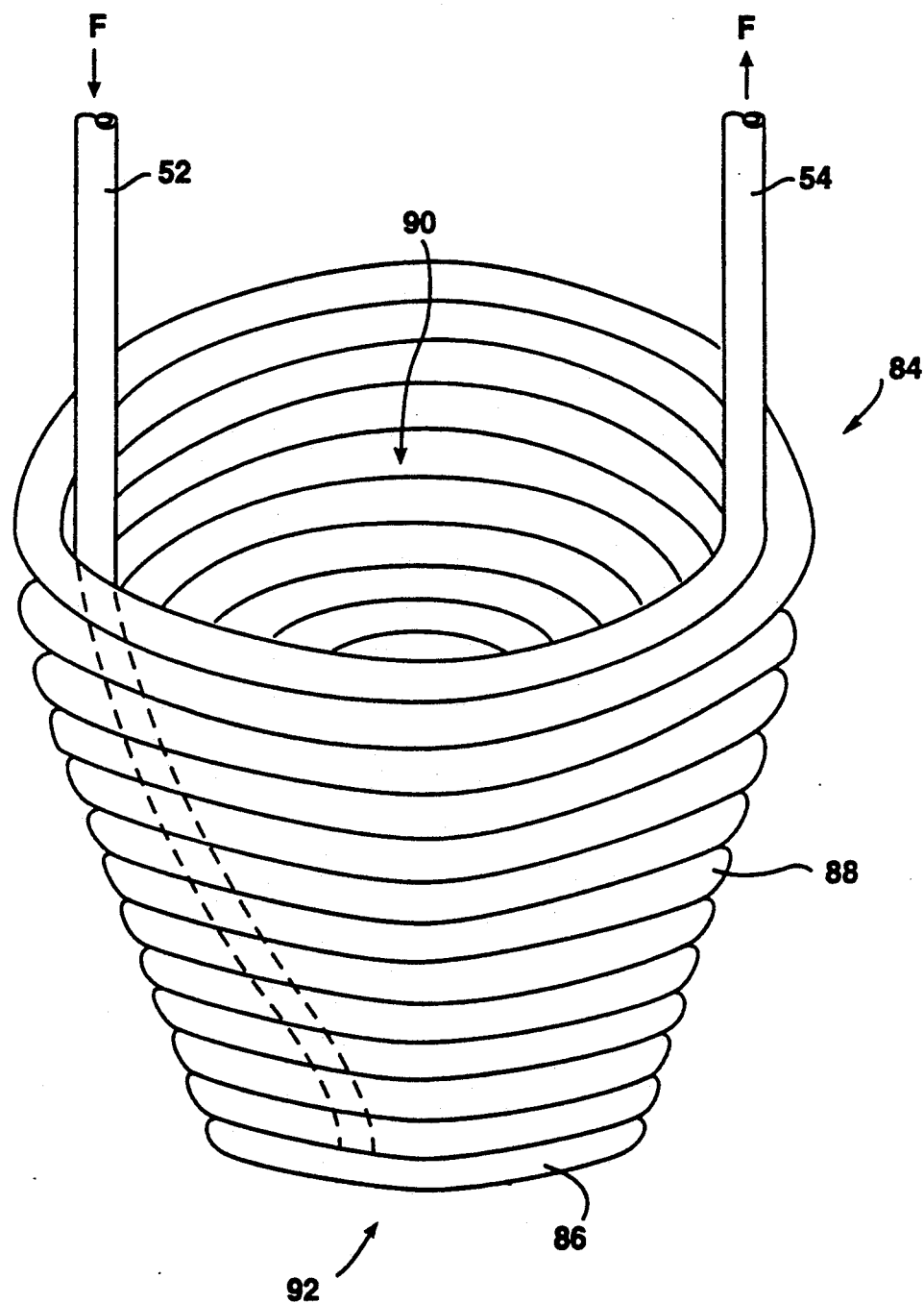
FIG. 4 is a perspective view of the cooling coil partially shown in FIG. 3.

With reference to both FIGS. 3 and 4, the coil 84 preferably takes the shape of an inverted, truncated cone having a substantially flat base portion 86 and a conical side portion 88. The coil 84 is preferably wound tightly enough that there is little interstitial space between adjacent coils, i.e. fluid flow through the coils is inhibited. Also preferably, the coil is wound such that there is a large opening 90 at the top and a small opening 92 at the bottom. The tubing 82 can be $\frac{1}{4}$" OD type 316 stainless steel refrigerator grade tubing, which is available from a large number of manufacturers. The tubing 82 is wound into coil 84 by well-known tube bending techniques. The collection surface 80 comprises the outer surfaces of the coil 84 which can contact gasses within trap chamber 78.

As best seen in FIG. 4, inlet 52 extends down to the base portion 86 of coil 84 and forms the start of the coil. Outlet 54 is connected to the top end of the coil 84. In this way, when a cool fluid F is caused to flow through the coil, the coolest fluid will be at the bottom of the coil where the gas temperature is the highest, and the warmed fluid will be at the top where is gas temperature is lower.

Referring again to FIG. 3, the placement of the inlet 32 with respect to the collection surface 80 is an important aspect of the present invention. To minimize restrictions to the flow of gasses between process chamber 12 and trap 14, it is desirable to have the flow path as short, straight, and unobstructed as possible. Baffles are therefore to be avoided. Gas flowing into chamber 78 will flow along an inlet flow axis A which, in the view of FIG. 3, extends out of the page. Radiant heat generated by the process chamber 12 and transmitted through the outlet 30, valve 34, and inlet 32 will also travel generally along axis A. If the radiant heat were to impinge upon the collection surface 80, condensed materials might be re-vaporized and the thermal trap 14 might become a less efficient. It is therefore desirable to make the axis of the collection surface (e.g. axis B of collection surface 80) perpendicular to the axis A to minimize the impingement of direct or reflect radiant heat from the process chamber 12.

Figure 5:
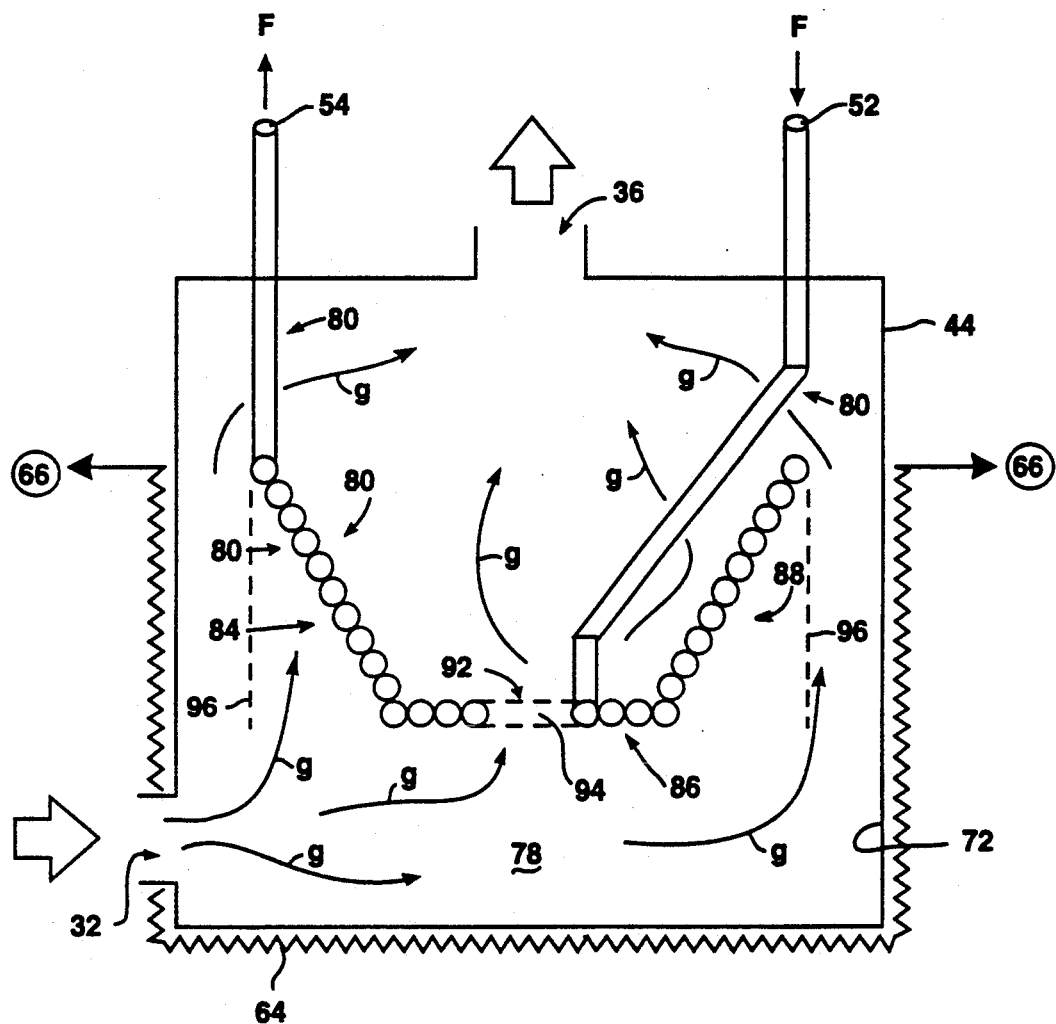
FIG. 5 is a schematic view of the thermal trap of the present invention which is used to illustrate its operation.

FIG. 5 is a schematic representation of the thermal trap, which will be used to discuss its operation. Pump 16 (not shown) is coupled to the outlet 36 of the trap and pumps the pressure within chamber 78 down to approximately 10–20 millitorr. The low pressure chamber draws gaseous material from the process chamber 12 into the chamber 78 by molecular flow. The gaseous material flows throughout the chamber 78 as indicated by the arrows g, with a general direction of flow towards outlet 36.

The trap 14 operates more efficiently under the above-described low-pressure conditions because there is little heat transfer between the walls of the enclosure and the collection surface. It should be noted, however, that the trap 14 will also operate at higher pressures, e.g. at atmospheric pressure, such as when the process chamber 12 is vented.

Since the walls of the enclosure are heated by coil 64, any gaseous material impinging upon inner surface 72 will be not condense thereupon as long as the temperature of the inner surface is greater than the condensation temperature of the gaseous material. Ammonium chloride, for example, condenses as a solid at about 125° C., so heating the inner surface to a temperature above that temperature will prevent solid condensation on the inner surfaces of the enclosure 44. In the present embodiment, the walls of the kettle 46 are heated to provide an inner surface 72 temperature of about 140° C. It is desirable to keep the inner surface 72 free of solid condensation to prevent the re-vaporization of the condensate (due, for example, to a change in the ambient temperature) and subsequent contamination of the process chamber 12 or pump 16.

In the present embodiment, the collection surface 80 includes all exposed surfaces of the coil 84 and of the portions of the tubing leading to the coil that are within the enclosure 44. Fluid F is circulated through the coil 84 by entering inlet 52 and exiting outlet 54. In the present embodiment, the fluid F is water having a temperature of about 15° C. The water can be supplied by the city water system, or it can be provided via a cooling loop. In either case, the water circulating through the coil 84 will maintain the temperature of the collection surface 80 well below the condensation temperature of 125° C. of the ammonium chloride, causing any gaseous ammonium chloride to condense as a solid on the collection surface 80. It is preferred that the coolest water be provided at the bottom of the coil 84 (where collection and gas temperature is the greatest), but the direction of fluid flow can be reversed with very little diminution in efficiency.

Initially, the solid condensate will form over all portions of the collection surface 80, although it will form faster on portions of the surface which are closer to the inlet 82. After a period of time, the condensate will plug the bottom opening with a plug of solid material 94 (shown in broken lines), after which the condensate will form primarily on the outer surfaces of side portions 88 of coil 84 and on the outer surfaces of base portion 86. Thereafter, the gas flow will be primarily around the outside of the coil 84, and relatively little condensation will occur within the coil.

As previously described, the coil 84 preferably takes the shape of an inverted, truncated cone. It has been found that this configuration presents a superior collection surface with minimal back-pressure to the process chamber 12. The flat base portion 86 of the coil 84 adds surface area without extending the coil too close to axis A of the inlet. Since the solid condensate forming on coil 84 is thickest near the bottom of the coil, the solid condensation takes on a cylindrical shape 96 around the coil 84. This permits a large mass of condensed solid material to be formed on the coil 84 without blocking gas flow to the outlet 36. If the coil were, for example, cylindrical, much less solid condensate would be able to form on the coil before the condensate at the bottom of the coil grew to the inner surface 72 of the kettle 46, cutting off gas flow to the outlet 36.

After 100–150 hours of use, the trap 14 is removed from the system 10 and cleaned. Since ammonium chloride is water-soluble, this cleaning can comprise rinsing out the interior of the trap 14 with water. The use of a simple water hose or sprayer effectively removes the ammonium chloride from the inside of the trap. The trap 14 is then dried and returned to the system 10.

The method and apparatus of the present invention is well suited for trapping ammonium chloride from the exhaust gas of a semiconductor process chamber. However, the method and apparatus can also be used to trap other types of gasses which can condense in solid form on a collection surface. The condensation may be either direct (i.e. the gas can sublime directly to solid form) or indirect (i.e. the gas goes through a brief liquid phase before solidfying). For example, the common semiconductor processing gas tetraethylorthosilicate (TEOS) can be trapped at temperatures less than about 250° C. The wall temperature of the enclosure should be above about 350° C. to prevent condensation of the TEOS on the inner surfaces of the enclosure.

While this invention has been described in terms of several preferred embodiments, it is contemplated that alterations, modifications and permutations thereof will become apparent to those skilled in the art upon a reading of the specification and study of the drawings. It is therefore intended that the following appended claims include all such alterations, modifications and permutations as fall within the true spirit and scope of the present invention.

What is claimed is:

1. A thermal trap comprising:
   an enclosure defining a trap chamber, said enclosure being provided with an inlet and an outlet;
   a condensable-solid collection surface disposed within said trap chamber, said collection surface comprising a length of tubing formed into a conical coil having a small end and a large end, with said small end being positioned nearer said inlet than said large end; and
   means for maintaining the temperature of said collection surface at or below the temperature at which a gas flowing into said inlet condenses into a solid form, wherein said means of maintaining the temperature of said collection surface comprises means for circulating a fluid through said tubing from said small end to said large end of said coil.

2. A thermal trap as recited in claim 1 wherein said inlet defines an inlet flow axis, and wherein said inlet flow axis does not impinge upon said collection surface.

3. A thermal trap as recited in claim 2 wherein said collection surface defines a collection surface axis, and wherein said inlet flow axis and said collection surface axis are substantially perpendicular.

4. A thermal trap comprising:
an enclosure defining a trap chamber, said enclosure being provided with an inlet and an outlet;
a condensable-solid collection surface disposed within said trap chamber;
means for maintaining the temperature of said collection surface at or below the temperature at which a gas flowing into said inlet condenses into a solid form; and
means for maintaining the temperature of an inner surface of said enclosure above said temperature at which said gas condenses into a solid form, without heating said collection surface above said temperature at which said gas condenses into a solid form.

5. A thermal trap as recited in claim 4 wherein said means for maintaining temperature of an inner surface of said enclosure comprises heating means.

6. A thermal trap as recited in claim 5 wherein said heating means is thermally coupled to an external surface of said enclosure.

7. A thermal trap as recited in claim 6 wherein said heating means comprises an electrical resistance heater which is thermally coupled to said external surface of said enclosure, and an electrical power source coupled to said electrical resistance heater.

8. A thermal trap as recited in claim 7 further comprising thermal insulation for isolating said electrical resistance heater from the ambient environment.

9. A deposition system with thermal trap comprising:
a processing chamber having inlet means and outlet means;
process gas coupled to said inlet means of said processing chamber;
a thermal trap including
(a) an enclosure defining a trap chamber, said enclosure being provided with an inlet and an outlet, where said inlet of said enclosure is coupled to said outlet means of said processing chamber,
(b) a condensable-solid collection surface disposed within said trap chamber, said collection surface comprising a length of tubing formed into a coil,
(c) means for maintaining the temperature of said collection surface at or below the temperature at which a gas flowing into said inlet condenses into a solid form, said means for maintaining the temperature of said collection surface comprising means for circulating a fluid through said tubing, and
(d) means for maintaining the temperature of an inner surface of said enclosure above said temperature at which said gas condenses into a solid form; and
pump means coupled to said outlet of said enclosure and operative to pump a gas from said process chamber and into said thermal trap.

10. A deposition system with thermal trap as recited in claim 9 wherein said means for maintaining the temperature of an inner surface of said enclosure comprises heating means.

11. A deposition system with thermal trap as recited in claim 10 wherein said heating means comprises an electrical resistance heater.

12. A deposition system with thermal trap as recited in claim 9 wherein radiant heat generated by process chamber does not directly impinge upon said collection surface.

13. A method for trapping a gaseous material comprising;
flowing a gaseous material into a trap chamber of an enclosure;
maintaining the temperature of a collection surface disposed within said trap chamber at a temperature at or below the temperature at which said gaseous material condenses into a solid form, whereby said gaseous material condenses as a solid on said collection surface; and
maintaining the temperature of an inner surface of said trap chamber above said temperature at which said gaseous material condenses into a solid form without heating said collection surface above said temperature at which said gas condenses into a solid form.

14. A method for trapping a gaseous material as recited in claim 13 wherein said step of maintaining the temperature of a collection surface comprises:
providing a length of tubing within said trap chamber, where at least a portion of an external surface of said tubing comprises said collection surface; and
circulating a fluid through said tubing.

15. A method for trapping a gaseous material as recited in claim 13 wherein said step of flowing a gaseous material into a trap chamber comprises flowing said gaseous material into said trap chamber in a direction which does not directly impinge upon said collection surface.

* * * * *